United States Patent [19]

Nagano

[11] Patent Number: 5,067,042
[45] Date of Patent: Nov. 19, 1991

[54] WIRING BOARD FOR FLAT PACKAGE TYPE INTEGRATED CIRCUIT DEVICE

[75] Inventor: Katsumi Nagano, Tokyo, Japan

[73] Assignee: Kabushiki Kaisha Toshiba, Tokyo, Japan

[21] Appl. No.: 300,233

[22] Filed: Jan. 23, 1989

Related U.S. Application Data

[63] Continuation of Ser. No. 121,238, Nov. 16, 1987, abandoned.

[30] Foreign Application Priority Data

Dec. 6, 1986 [JP] Japan ............... 61-290797

[51] Int. Cl.$^5$ .............................. H01R 9/00
[52] U.S. Cl. .................. 361/406; 361/409; 361/418
[58] Field of Search ........... 361/398, 400, 403, 404, 361/406, 409, 418; 174/260; 439/70, 72

[56] References Cited

U.S. PATENT DOCUMENTS

| | | | |
|---|---|---|---|
| 4,016,463 | 4/1977 | Beall et al. | 361/383 |
| 4,195,195 | 3/1980 | de Miranda et al. | 361/406 X |
| 4,417,296 | 11/1983 | Schelhorn | 361/406 X |
| 4,489,365 | 12/1984 | Daberkoe | 174/68.5 X |
| 4,562,513 | 12/1985 | Arnold et al. | 174/68.5 X |
| 4,600,970 | 7/1986 | Bauer | 174/52 FP X |
| 4,725,692 | 2/1988 | Ishii et al. | 174/52 FP |
| 4,734,980 | 4/1988 | Nakamura et al. | 174/68.5 X |
| 4,753,820 | 6/1988 | Cusack | 174/52 FP X |
| 4,754,370 | 6/1988 | DeTizio et al. | 174/52 FP X |
| 4,763,409 | 8/1988 | Takekawa et al. | 174/52 FP X |

Primary Examiner—Leo P. Picard
Assistant Examiner—Paramita Ghosh
Attorney, Agent, or Firm—Finnegan, Henderson, Farabow, Garrett and Dunner

[57] ABSTRACT

A wiring board for solder mounting of a flat package type integrated circuit device. The flat package type integrated circuit device has a plurality of leads arranged at spaced intervals, the plurality of leads including a reference lead, an end lead, and remaining leads positioned between the reference lead and end lead. The wiring board includes a board, a plurality of first pattern pads, each having a predetermined surface area, arranged on the board for mounting the remaining leads thereon, a second pattern pad having a second predetermined surface area arranged on the board for mounting the reference lead thereon, the second predetermined surface area of the second pattern pad being larger than the predetermined surface area of the first pattern pads, and a third pattern pad having a third predetermined surface area arranged on the board for mounting the end lead thereto, the third predetermined surface area of the third pattern pad being larger than the predetermined surface area of the first pattern pads.

4 Claims, 7 Drawing Sheets

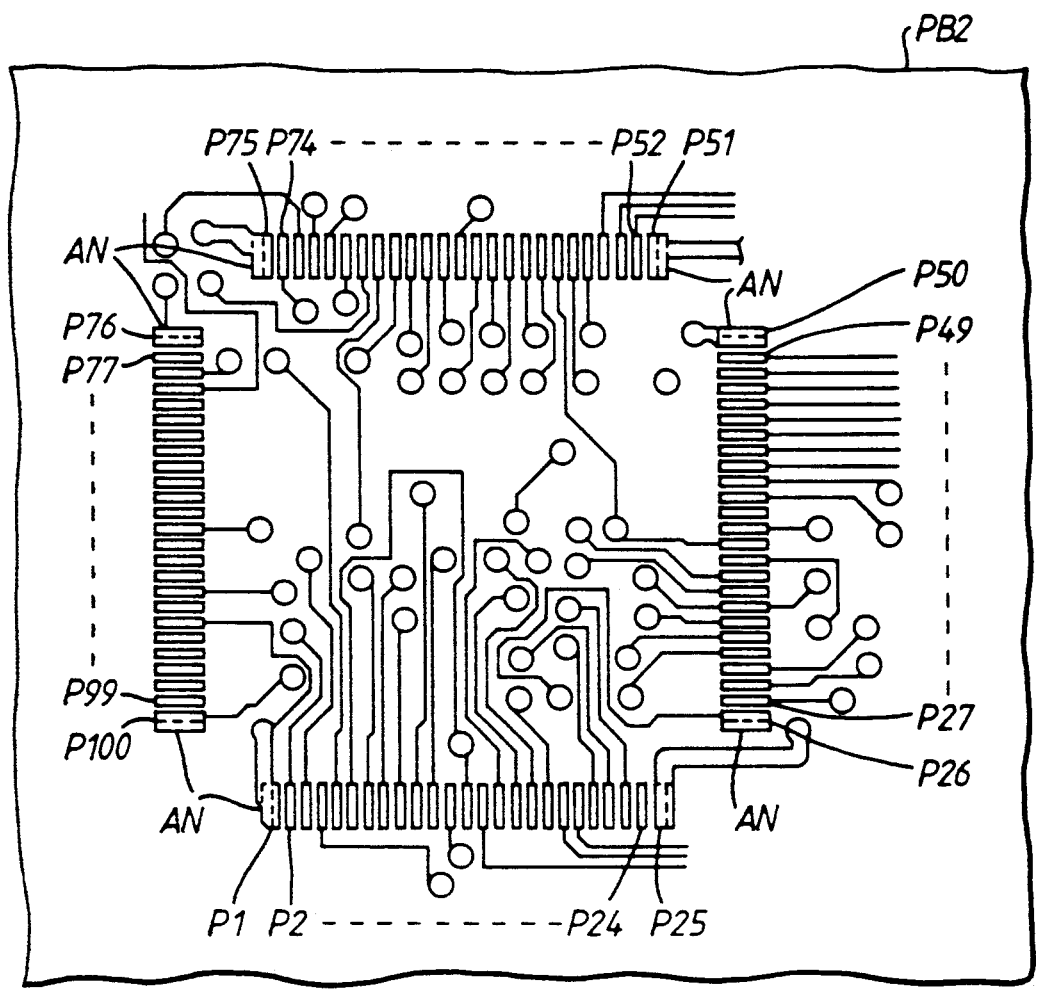
Fig. 11.
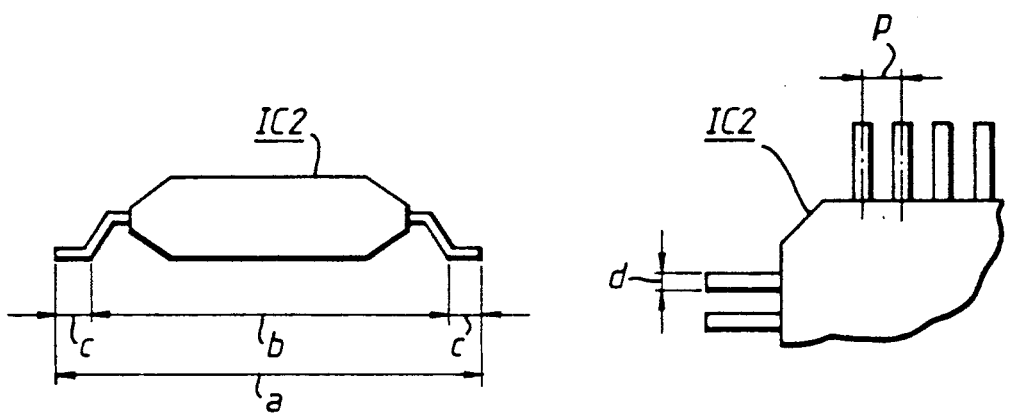
Fig. 12A.
Fig. 12B.

WIRING BOARD FOR FLAT PACKAGE TYPE INTEGRATED CIRCUIT DEVICE

This application is a continuation of application Ser. No. 07/121,238, filed Nov. 16, 1987, now abandoned.

BACKGROUND OF THE INVENTION

1. Field of the Invention

The present invention relates to wiring boards on which flat package type integrated circuit devices are mounted.

2. Discussion of Background

Conventionally, in typical wiring boards for flat package type integrated circuit devices, pattern pads which make contact with the leads of the integrated circuit devices are formed in rectangular shapes.

However, in conventional wiring boards, the pattern pads all have the same configuration and the same area and, furthermore, they are formed only slightly wider than the contact portions of the leads. Thus, the amount of solder required for soldering is restricted. Therefore, when soldering is carried out, there is a tendency for defective soldering to occur, such as leads becoming detached from the pattern pads.

Also, since the pattern pads are all the same shape, the pattern pad on which the reference lead of the integrated circuit devices should be mounted is difficult to distinguish. Accordingly, the mounting direction of the integrated circuit devices easily can be mistaken.

SUMMARY OF THE INVENTION

It is an object of the present invention to provide a wiring board for a flat package type integrated circuit device which makes it possible to reduce the occurrence of poor soldering.

It is another object of the present invention to provide a wiring board for a flat package type integrated circuit device with an easily recognizable pattern pad for mounting the reference lead of an integrated circuit device.

According to one aspect of the present invention, there is provided a wiring board for solder mounting of a flat package type integrated circuit device having a plurality of leads arranged at spaced intervals, the plurality of leads including a reference lead, an end lead, and remaining leads positioned between the reference lead and end lead, comprising a board; a plurality of first pattern pads, each having a predetermined surface area, arranged on the board for mounting the remaining leads thereon; a second pattern pad having a second predtermined surface area arranged on the board for mounting the reference lead thereon, the second predetermined surface area of the second pattern pad being larger than the predetermined surface area of the first pattern pads; and a third pattern pad having a third prdetermined surface area arranged on the board for mounting the end lead thereto, the third predetermined surface area of the third pattern pad being larger than the predetermined surface area of the first pattern pads.

It is preferred that the first pattern pads are arranged in at least one line between the second and third pattern pads, the adjacent pads in the line being equally spaced from one another, each of the second and third pattern pads having a width greater than the width of each first pattern pad for more reliable mounting of the reference lead and end lead.

Further, it is preferred that the second pattern pad has a shape different from the shape of the third pattern pad for distinguishing the mounting position of the reference lead.

BRIEF DESCRIPTION OF THE DRAWINGS

These and other objects and advantages of this invention will become more apparent and more readily appreciated from the following detailed description of the presently preferred exemplary embodiments, taken in conjunction with the accompanying drawing of which:

FIGS. 9 to 14 show another embodiment of the present invention in which;

FIG. 9 is a plan view showing a pattern of a wiring board;

FIG. 11 is a plan view showing the actual wiring of the wiring board shown in FIG. 9;

FIG. 12A is a side view of the flat package type IC device of FIG. 10A for explanation of the design rule for the pattern;

FIG. 12B is a partial plan view of the flat package type IC device of FIG. 10A for explanation of the design rule for the pattern;

FIG. 13 is a plan view showing the dimensions of the pattern of FIG. 9; and

FIG. 14 is a plan view of the essential part of the pattern showing the state of connection between the pattern and the leads of the IC device.

DETAILED DESCRIPTION OF THE PREFERRED EMBODIMENTS

The following is a detailed description of an embodiment of the present invention with reference to the drawings.

Figure 1:
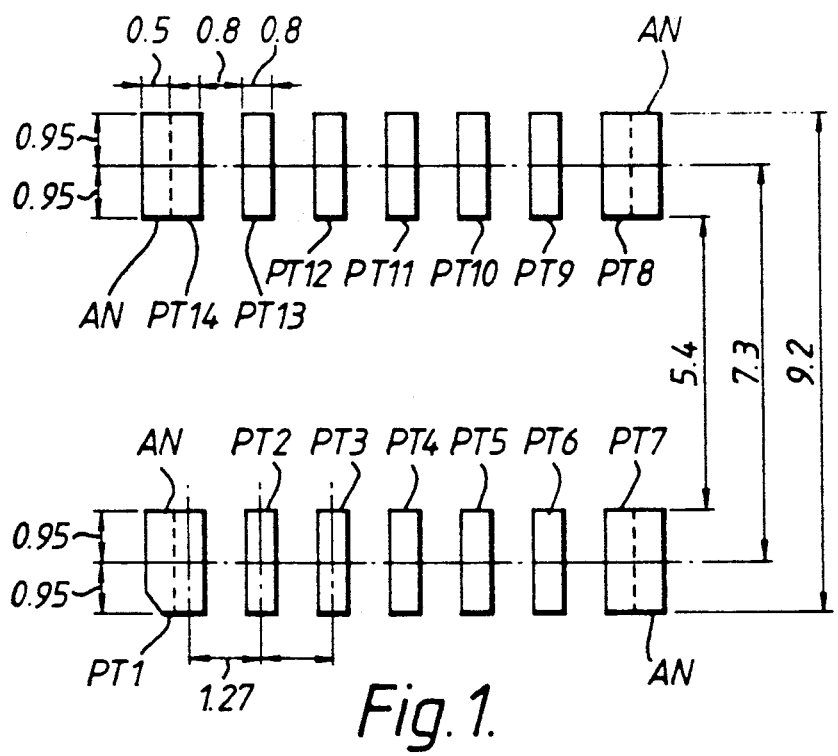
FIG. 1 is a plan view showing a pattern of a wiring board according to the present invention.
Figure 2A:
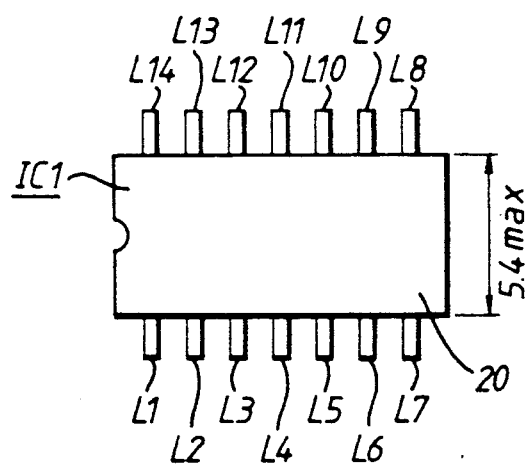
FIG. 2A is a plan view of a flat package type IC device which is mounted on the wiring board of the present invention.
Figure 2B:
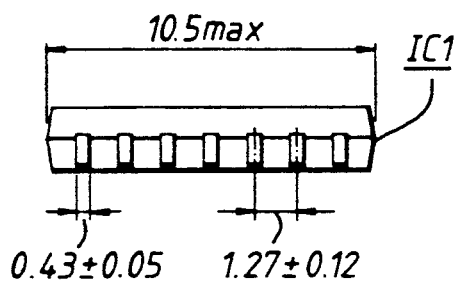
FIG. 2B is a front view of the flat package type IC device of FIG. 2A.
Figure 2C:
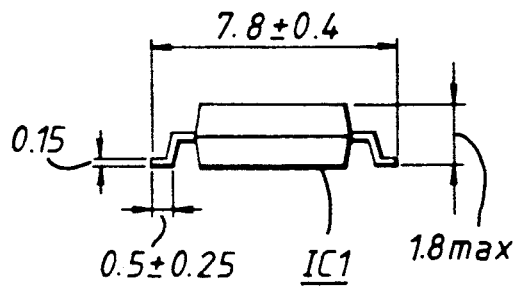
FIG. 2C is a side view of the flat package type IC device of FIG. 2A.

FIG. 1 shows the pattern in which a flat package type integrated circuit device (hereinafter called FP-type IC device) IC1, shown in FIG. 2, is mounted. FP-type IC device IC1 comprises a main body 20 packaging an IC chip therein and a plurality of leads L1-L14 electrically connected to the IC chip. Leads L1-L7 and L8-L14 having a gull wing-shape extend outwardly from main body 20 in two lines. The first line of leads L1-L7 and the second line of leads L8-L14 are arranged in parallel with each other. Leads L1-L7 and leads L8-L14 are arranged on main body 20 at equal intervals, respectively. A plurality of pattern pads PT1-PT14 for mounting leads L1-L14 are formed on a board by a printing method. Pattern pads PT1-PT7 and pattern pads PT8-PT14 are arranged at equal intervals in two parallel lines. Leads L2-L6 and L9-L13 are mounted on first pattern pads PT2-PT6 and PT9-PT13, which are rectangles of a size 0.8×1.9 mm. Also, a second pattern pad PT1, which is the reference pattern pad for mounting lead L1, and third pattern pads PT7, PT8 and PT14, which are connected to leads L7, L8 and L14, are 1.3×1.9 mm in size, the added size being provided by extended portions AN of width 0.5 mm. Extended portions AN corresponding to leads L1 and L7 are formed with pattern pads PT1 and PT7 to extend outside in the first line direction of pattern pads PT2-PT6. Extended portions AN corresponding to leads L8 and L14 are formed at pattern pads PT8 and PT14 to extend outside in the second line direction of pattern pads PT9-PT13. Furthermore, second pattern pad PT1 is made a different shape from third pattern pads PT7, PT8 and PT14 by cutting away a part of extended portion AN so that it is distinguishable from third pattern pads PT7, PT8 and PT14.

Figure 3:
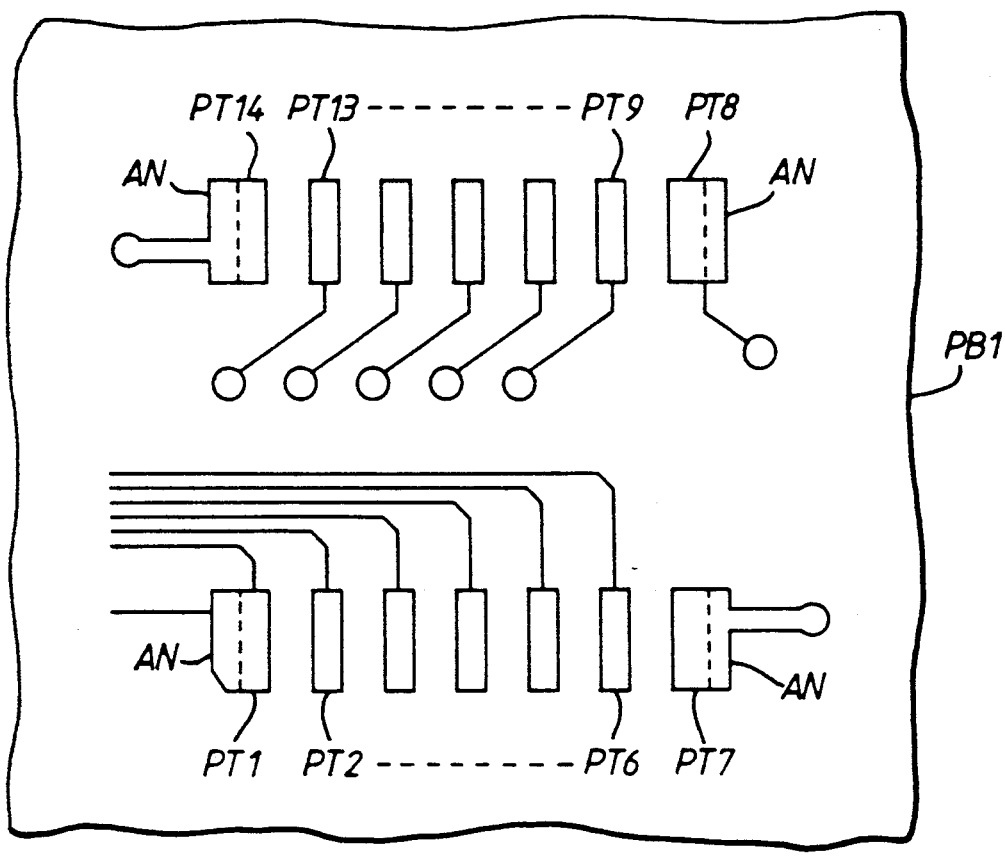
FIG. 3 is a plan view showing the actual wiring of the wiring board shown in FIG. 1.

FIG. 3 shows an example of the actual wiring of a wiring board PB1 with first, second and third pattern pads PT2-PT6, PT9-PT13, PT1, PT7, PT8 and PT14. Each of the wiring patterns connected to pattern pads PT7 and PT14 is made of a thick conductor for applying the power to pads PT7 and PT14 from power source. Each of the wiring patterns connected to pattern pads PT1-PT6 and PT8-PT13 is made of thin conductor.

Figure 4A:
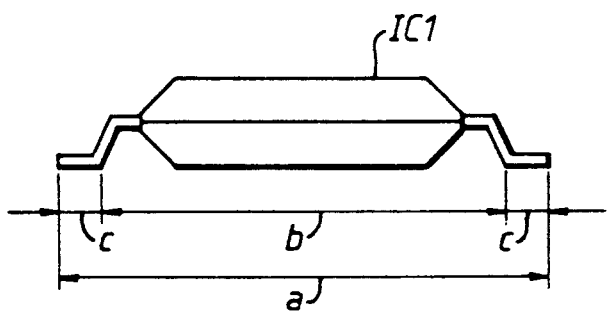
FIG. 4A is a side view of a flat package type IC device for explanation of the design criteria for the pattern.
Figure 4B:
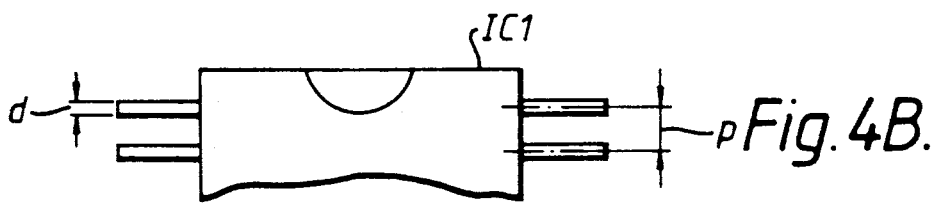
FIG. 4B is a partial plan view of the flat package type IC device of FIG. 4A for explanation of the design rule for the pattern.
Figure 5:
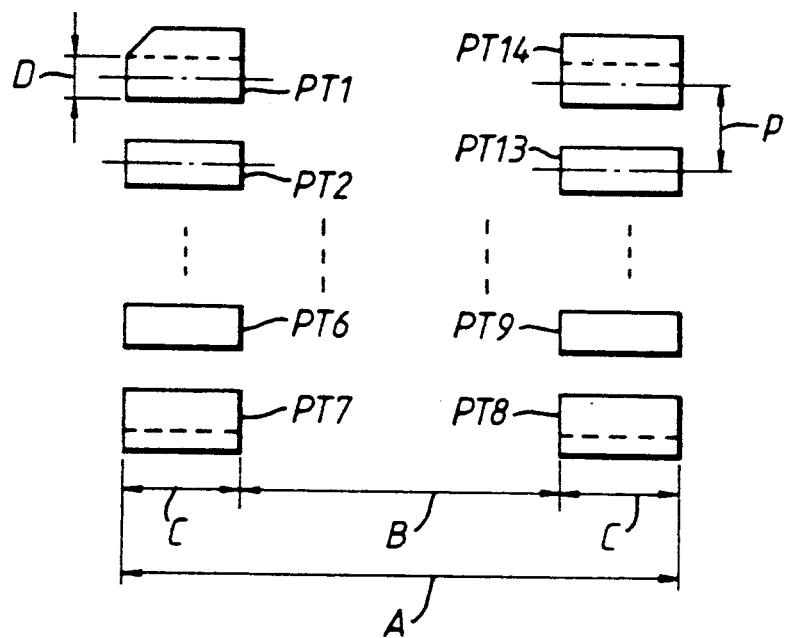
FIG. 5 is a plan view showing the dimensions of the pattern FIG. 1.

The design rule for first, second and third pattern pads PT2-PT6, PT9-PT13, PT1, PT7, PT8 and PT14 are described with reference to FIGS. 4 and 5.

The external dimensions of FP-type IC device IC1 are determined as follows.

a: Distance between tips of leads,
  $a_{max}$; maximum value
  $a_{min}$; minimum value
b: Distance between insides of the lead surfaces which make contact with the pattern pads, $b_{min}$; minimum value
c: Length of lead surface which makes contact with the pattern pad, $c_{max}$; maximum value
d: Width of lead
p: Pitch between lead centers.

Under the above conditions, the dimensions of PT2-PT6, PT9-PT13, PT1, PT7, PT8 and PT14 are determined as follows.

$$A = a_{max} + 1.0 \quad \text{(Units: mm)}$$
$$B = a_{min} - 2 \times c_{max} - 0.5$$
$$C = (A - B)/2$$
$$D < p - 0.25$$

A and B are the external and internal widths between pattern pads, C is the length of a pattern pad and D is the width of a pattern pad. The relationship between the pitch p between lead centers and the width D of the pattern pads is as shown in Table 1.

TABLE 1

| Lead pitch (p) | Width of the pattern pad (D) |
| --- | --- |
| 1.27 | 0.8 |
| 0.8 | 0.5 |

Figure 6:
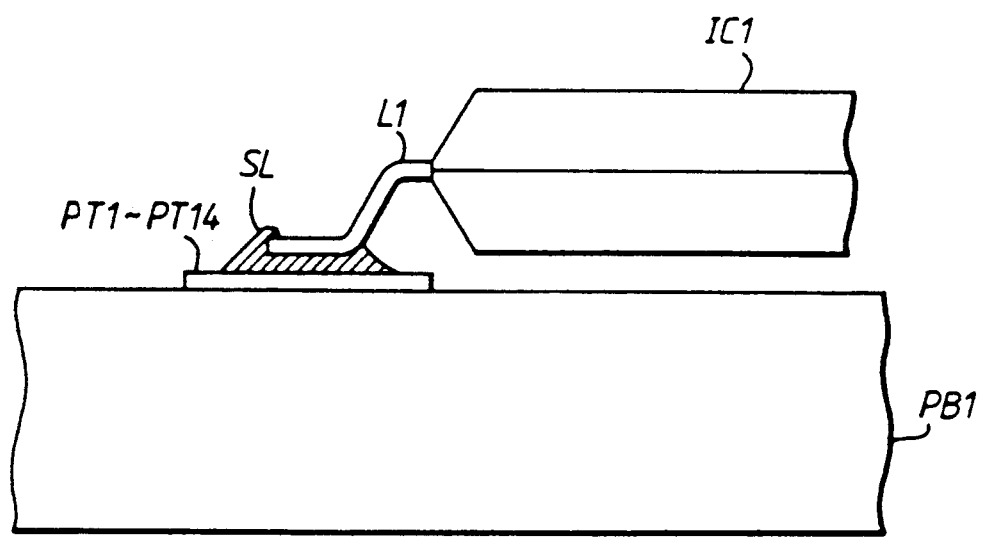
FIG. 6 is a partial front view showing the state of connection between the pattern of FIG. 1 and the leads of the IC device.
Figure 7:
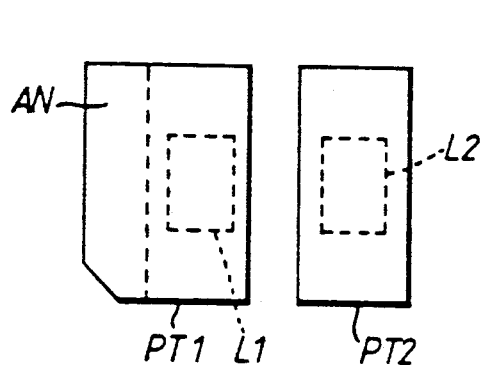
FIG. 7 is a plan view showing the essential part of the pattern of FIG. 1.

FIGS. 6 and 7 show the state of contact between the pattern pads and leads L1 of FP-type IC device IC1.

In the condition where first to third pattern pads PT1-PT14 and leads L1-L14 are soldered by solder SL, each of pattern pads PT1-PT14 has, as shown in FIG. 6, a margin of at least 0.5 mm on one side of leads L1-L14, and 0.25 mm on the other side of leads L1-L14.

Moreover, along the line of the pattern pads, as shown in FIG. 7, in the cases of first pattern pads PT2-PT6 and PT9-PT13, there are margins of approximately 0.2 mm on the left and right sides. Also, in the cases of second pattern pad PT1 and third pattern pads PT7, PT8 and PT14, additional margins of 0.5 mm are added to the above margins. Consequently, it is possible to coat a larger amount of solder on second and third pattern pads PT1, PT7, PT8 and PT14 than on first pattern pads PT2-PT6 and PT9-PT13.

Furthermore, the contact positions of leads L1, L7, L8 and L14 on second and third pattern pads PT1, PT7, PT8 and PT14, are on positions which do not include extended portions AN, as shown in FIG. 7.

For the soldering process, the so-called reflow soldering method typically is used. Solder paste is applied onto first, second and third pattern pads PT2-PT6, PT9-PT13 PT1, PT7, PT8 and PT14. After leads L1-L14 of FP-type IC device IC1 have been placed on the pattern pads, the solder is melted in a high-temperature atmosphere and then hardened by cooling.

In the above embodiment, extended portions AN are provided on second and third pattern pads PT1, PT7, PT8 and PT14 to which leads L1, L7, L8 and L14 in FP-type IC device IC1 are mounted, and their surface areas are made larger than first pattern pads PT2-PT6 and PT9-PT13 to which leads L2-L6 and L9-L13 are mounted. Consequently, since the amount of solder on the second and third pads is increased, it is easier to connect the pattern pads and the leads securely and better connections are achieved.

Moreover, second pattern pad PT1 to which lead L1 of FP-type IC device IC1 is mounted has a different shape than third pattern pads PT7, PT8 and PT14 to which leads L7, L8 and L14 are mounted. Consequently, since second pattern pad PT1 can be easily distinguished, FP-type IC device mounting errors can be reduced substantially.

Furthermore, the shape of second pattern pad PT1 is changed by cutting off a portion of extended portion AN. Consequently, since the same area is maintained for the portion to which the lead is connected as in the other pattern pads, there is no deterioration in the connectability of this lead.

Figure 8:
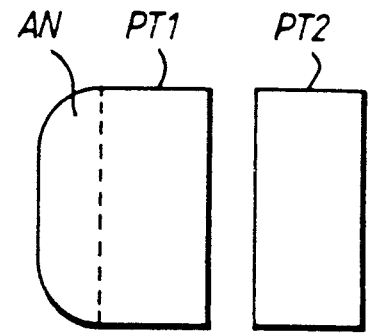
FIG. 8 is a plan view showing the essential part of a variation of the pattern of FIG. 1.

The shape of second pattern pad PT1 is not limited to that shown in FIG. 1. It is possible, for example, to make a bow shape, as shown in FIG. 8.

Next, another embodiment of the present invention is described.

Figure 9:
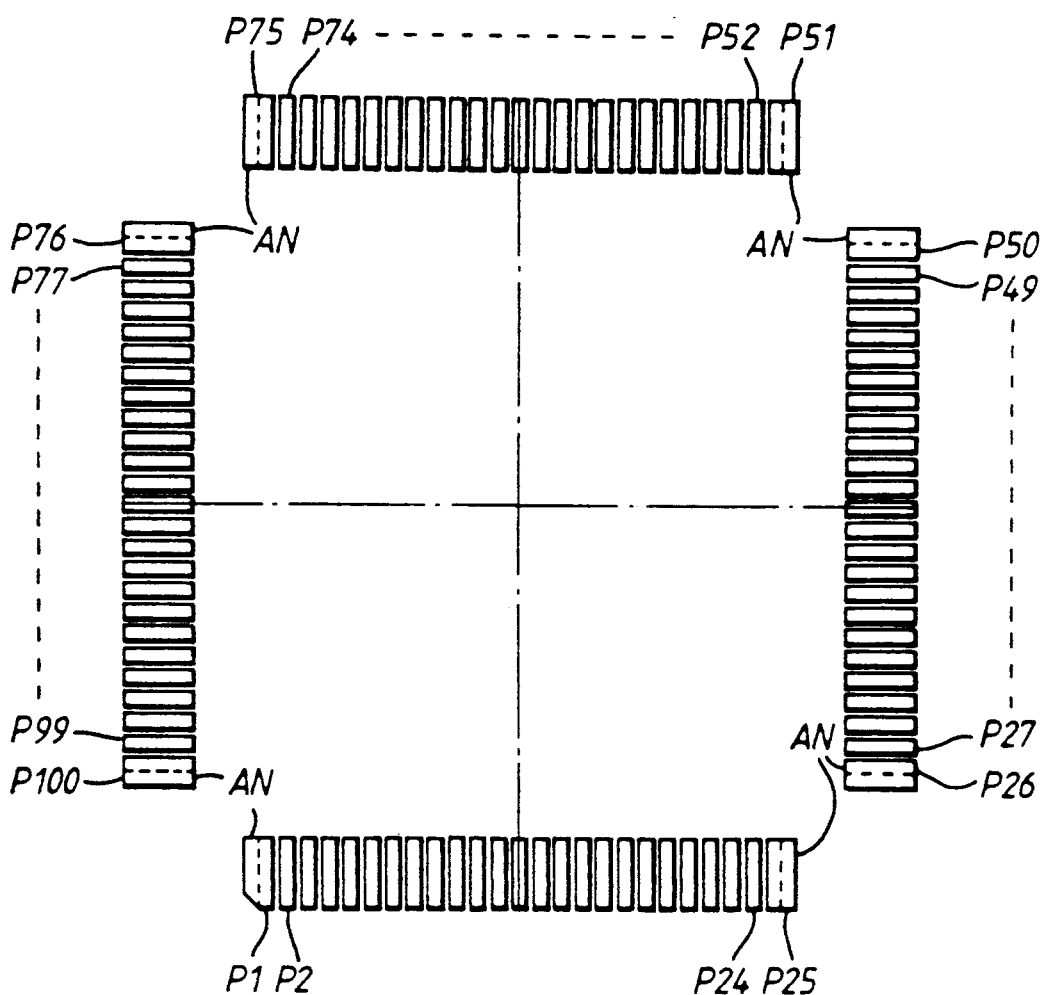
Figure 10A:
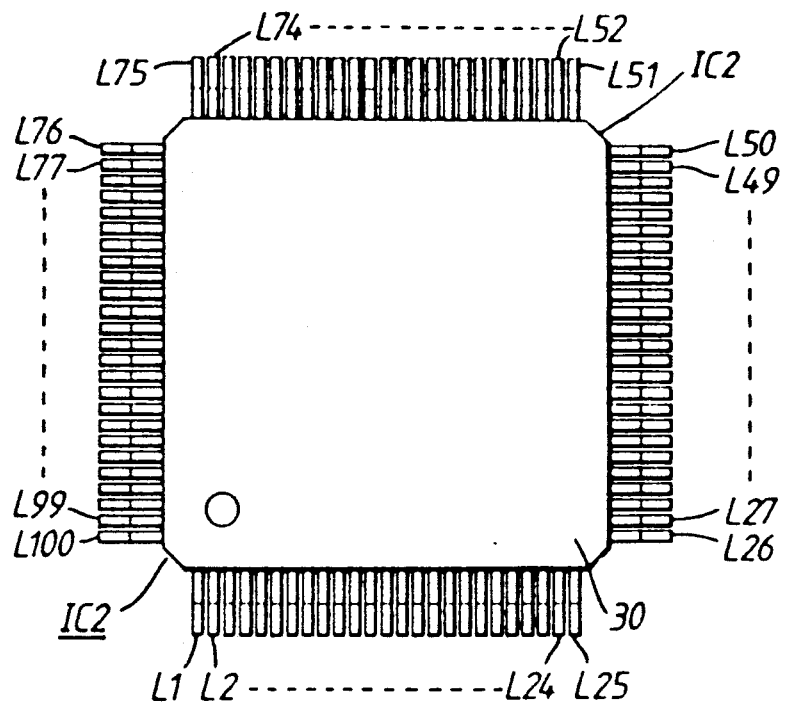
FIG. 10A is a plan view of a flat package type IC device having 4-directional leads which is used with the present invention.
Figure 10B:
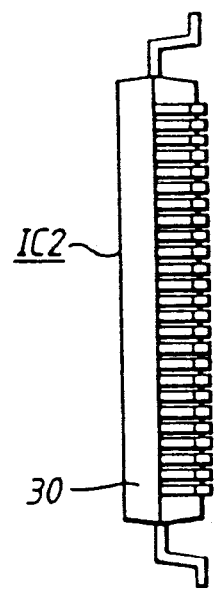
FIG. 10B is a side view of a flat package type IC device having 4-directional leads.

FIG. 9 shows the patterns on which an FP-type IC device IC2 having 4-directional leads, as shown in FIGS. 10A and 10B, is mounted. FP-type device IC2 comprises a main body 30 packaging an IC chip therein, and a plurality of leads L1–L100 electrically connected to the IC chip. Alternate pairs of leads L1–L100 have gull wing-shape, and the leads extend from main body 30 in four directions. The first line of leads L1–L25, the second line of leads L26–L50, the third line of leads L51–L75 and the fourth line of leads L76–L100 are arranged to form a square. Leads L1–L25, leads L26–L50, leads L51–L75 and leads L76–L100 are arranged on main body 30 at equal intervals, respectively. A plurality of pattern pads P1–P100 for mounting leads L1–L100 are formed on a board by a printing method. Each line includes pattern pads P1–P25, P26–P50, P51–P75 and P76–P100, respectively, arranged at equal intervals. Pattern pads P1–P25 and P51–P75 are on opposite sides of the IC device in parallel lines and pattern pads P26–P50 and P76–P100 are arranged similarly to form a square. Leads L2–L24, L27–L49, L52–L74 and L77–L99 of FP-type IC device IC2 are mounted on first pattern pads P2–P24, P27–P49, P52–P74 and P77–P99, respectively. First pattern pads P2–P24, P27–P49, P52–P74 and P77–P99 are rectangularly shaped and measure 0.55 ×2.5 mm. Moreover, a second pattern pad P1 is the reference pattern for mounting lead L1. Leads L25, L26, L50, L51, L75, L76 and L100 are respectively mounted on third pattern pads P25, P26, P50, P51, P75, P76 and P100. Third pattern pads P25, P26, P50, P51, P75, P76 and P100 each measure 1.05×2.5 mm, since extended portions AN of width 0.5 mm lie in line with and on either side of pattern pads P2–P24, P27–P49, P52–P74 and P77–P99. Furthermore, second pattern pad P1 is a different shape from third pattern pads P25, P26, P50, P51, P75, P76 and P100. A part of extended portion AN is cut away so that it is distinguishable from third pattern pads P25, P26, P50, P51, P75, P76 and P100.

FIG. 11 shows an example of the actual wiring of a wiring board PB2 for first, second and third pattern pads P2–P24, P27–P49, P52–P74, P77–P99, P1, P25, P26, P50, P51, P75, P76 and P100.

Figure 13:
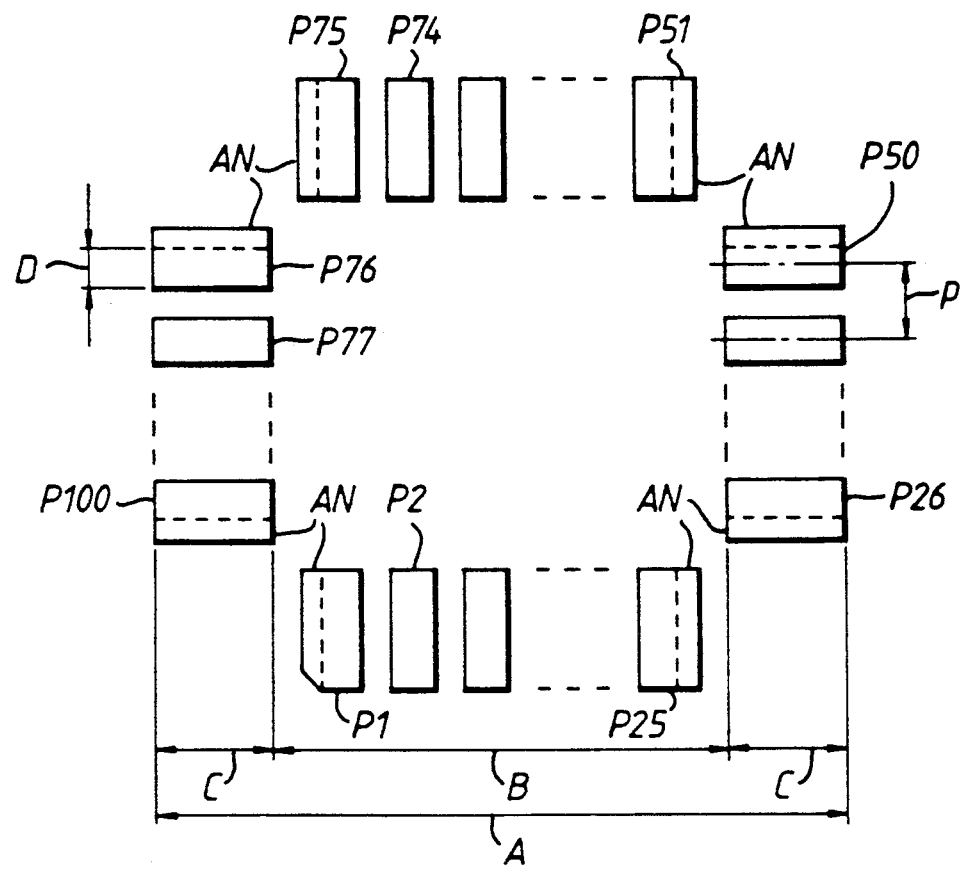

Next, the design rule for the first, second and third pattern pads are described with reference to FIGS. 12 and 13.

The external dimensions of FP-type IC device IC2 are determined as follows.
a: Distance between tips of leads,
  $a_{max}$; maximum value
  $a_{min}$; minimum value
b: Distance between insides of the lead surfaces which make contact with the pattern pads,
  $b_{min}$; minimum value
c: Length of lead surface which makes contact with the pattern pad,
  $c_{max}$; maximum value
d: Width of lead
p: Pitch between lead centers.

Under the above conditions, the dimensions of the first, second and third pattern pads P1–P100 are determined as follows.

$$A = a_{max} + 2.0 \quad \text{(Units: mm)}$$
$$B = b_{min} - 0.6$$
$$C = (A - B)/2$$
$$D > d + 0.1$$

Here, A and B are the external and internal widths between pattern pads, C is the length of a pattern pad and D is the width of a pattern pad. The relationship between the pitch p between lead centers and the width D of the pattern pads is as shown in Table 2.

TABLE 2

| Lead pitch (p) | Width of the pattern pad (D) |
|---|---|
| 1.0 | 0.5 |
| 0.8 | 0.5 |
| 0.7 | 0.4 |
| 0.65 | 0.4 |

Figure 14:
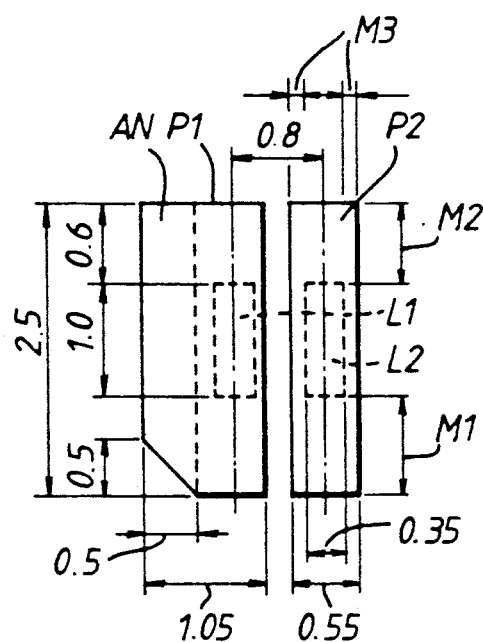

FIG. 14 shows the state of contact between the pattern pads and leads L1–L100 of the FP-type IC device IC2.

In the condition where first to third pattern pads P1–P100 and leads L1–L100 are soldered by solder SL, each of pattern pads P1–P100 has, as shown in FIG. 14, a margin $M_1$ (minimum 0.1 mm) on one side of leads L1–L100, and a margin $M_2$ (minimum 0.3 mm) on the other side of leads L1–L100.

Moreover, along the line of the pattern pads, as shown in FIG. 14, in the cases of first pattern pads P2–P24, P27–P49, P52–P74 and P77–P99, there are margins $M_3$ (0.1 mm) on the left and right sides. Also, in the cases of second pattern pad P1 and third pattern pads P25, P26, P50, P51, P75, P76 and P100, margins of 0.5 mm are established added on the outside of the above margins $M_3$. Consequently, it is possible to coat a larger amount of solder on second and third pattern pads P1, P25, P26, P50, P51, P75, P76 and P100, than on first pattern pads P2–P24, P27–P49, P52–P74 and P77–P99.

Furthermore, the contact positions of leads L1, L25, L26, L50, L51, L75, L76 and L100 on second and third pattern pads P1, P25, P26, P50, P51, P75, P76 and P100, are on positions which do not include extended portions AN, as shown in FIG. 14.

The soldering process, for the FP-type IC device IC2 having four directional leads is the same as for the case of FP-type IC device IC1. Moreover, in this case also, the shape of second pattern pad P1 may be altered as shown in FIG. 8.

Various other modifications could be made in the present invention without departing from the scope or spirit of the following claims.

As described above, in the present invention, extended portions are provided to a second pattern pad and a third pattern pads. The reference lead of an FP-type IC device is mounted on the second pattern pad, and the leads in the end positions with the exception of the reference lead are mounted on the third pattern pads. On the first pattern pads, the other leads are mounted. The surface area of second and third pattern pads are made larger than that of first pattern pads. Therefore, since it is possible to increase the amount of solder coated on the second and third pattern pads, it is possible to connect the pattern pads and the leads securely and to reduce substantially the occurrence of poor connections. Further, since the second pattern pad on which the reference lead is mounted has a different shape from the third pattern pads, the second pattern pad can be distinguished easily to reduce FP-type IC device mounting errors.

What is claimed is:
1. A wiring board for solder mounting a flat package type integrated circuit device having a plurality of leads arranged in pairs in first and second parallel lines, the first line including a reference lead, an end lead, and remaining leads positioned between the reference and end leads, and the second line including two end leads and remaining leads positioned between the end leads, the wiring board comprising:

a board;

a plurality of first pattern pads, each having a first predetermined surface area, arranged on the board in positions corresponding to the remaining leads;

a reference pattern pad having a second predetermined surface area including a mounting portion arranged on the board in a position corresponding to the reference lead and a first width extension portion, the second predetermined surface area being larger than the first predetermined surface area and the first width extension portion defining a unique pad shape such that the width of the reference pattern pad is greater than the width of the first pattern pads; and end pattern pads having a third predetermined surface area including a mounting portion arranged on the board in positions corresponding to the end leads and a second width extension portion, the third predetermined surface area being larger than the first predetermined surface area and the second width extension portion defining a pad shape such that the width of the end pattern pad is greater than the width of the first pattern pads.

2. The wiring board of claim 1 wherein the first pattern pads are arranged in pairs in first and second parallel lines, the adjacent pattern pads in the first and second lines are equally spaced from one another, and the first, reference, and end pattern pads are of uniform length.

3. A wiring board for solder mounting a flat package type integrated circuit device having a main body and a plurality of leads arranged in four lines to extend from the main body in four directions, the first line including a reference lead, an end lead, and remaining leads positioned between the reference and end leads, and the second, third and fourth lines, respectively, including two end leads, and remaining leads positioned between the end leads, the wiring board comprising:

a board;

a plurality of first pattern pads, each having a first predetermined surface area, arranged on the board in positions corresponding to the remaining leads of the first, second, third and fourth lines;

a reference pattern pad having a second predetermined surface area including a mounting portion arranged on the board in a position corresponding to the reference lead and a first width extension portion, the second predetermined surface area being larger than the first predetermined surface area and the first width extension portion defining a unique pad shape such that the width of the reference pattern pad is greater than the width of the first pattern pads; and end pattern pads having a third predetermined surface area including a mounting portion arranged on the board in positions corresponding to the end leads and a second width extension portion, the third predetermined surface area being larger than the first predetermined surface area and the second extension portion defining a pad shape such that the width of the end pattern pad is greater than the width of the first pattern pads.

4. The wiring board of claim 3 wherein the first pattern pads are arranged in the first line between the reference and end pattern pads, and first pattern pads in the second, third, and fourth lines positioned between two end pattern pads, respectively, the adjacent pattern pads in the lines are equally spaced from one another, and the first reference, and end pattern pads are of uniform length.

* * * * *